(12) United States Patent
Furukawa

(10) Patent No.: US 7,511,542 B2
(45) Date of Patent: Mar. 31, 2009

(54) FREQUENCY DIVIDING CIRCUIT

(75) Inventor: Osamu Furukawa, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 11/939,884

(22) Filed: Nov. 14, 2007

(65) Prior Publication Data

US 2008/0122498 A1   May 29, 2008

(30) Foreign Application Priority Data

Nov. 24, 2006   (JP) ............................. 2006-317022

(51) Int. Cl.
*H03K 21/00* (2006.01)
(52) U.S. Cl. ...................... 327/115; 327/117
(58) Field of Classification Search ....................... None
See application file for complete search history.

(56) References Cited

U.S. PATENT DOCUMENTS

| | | | |
|---|---|---|---|
| 3,946,321 A * | 3/1976 | Krolik ......................... 327/117 |
| 4,651,334 A * | 3/1987 | Hayashi ....................... 377/108 |
| H1199 H * | 6/1993 | Korn et al. .................... 377/47 |
| 6,404,244 B2 * | 6/2002 | Flecheux ...................... 327/115 |
| 6,611,573 B2 * | 8/2003 | Trivedi et al. ................. 377/48 |
| 6,958,635 B2 * | 10/2005 | Fahim ......................... 327/155 |
| 7,062,005 B2 * | 6/2006 | Gresham ...................... 375/375 |
| 7,230,458 B2 * | 6/2007 | DaDalt ........................ 327/113 |

FOREIGN PATENT DOCUMENTS

JP   07-087360   9/1995

* cited by examiner

*Primary Examiner*—Cassandra Cox
(74) *Attorney, Agent, or Firm*—Sughrue Mion, PLLC

(57) ABSTRACT

A frequency dividing circuit includes: a D-type flip flop that outputs frequency-divided signal synchronized with input clock and reverse phase signal corresponding to the frequency-divided signal; a variable delay circuit that generates a delay feedback signal delayed by a specific delay time from the reverse phase signal input from the D-type flip flop and feeds back the delay feedback signal to the D-type flip flop; and a delay adjusting circuit that detects a phase difference between the reverse phase signal input from the D-type flip flop and the delay feedback signal input from the variable delay circuit, obtains detected results, and outputs to the variable delay circuit a control signal to perform control so that the delay time becomes time required to ensure setup/hold time of the D-type flip flop, based on the detected results.

4 Claims, 4 Drawing Sheets

FREQUENCY DIVIDING CIRCUIT

BACKGROUND OF THE INVENTION

1. Field of the Invention

The present invention relates to a frequency dividing circuit, and in particular, relates to a frequency dividing circuit suitable for high speed operations.

Priority is claimed on Japanese Patent Application No. 2006-317022, filed Nov. 24, 2006, the content of which is incorporated herein by reference.

2. Description of Related Art

FIG. 4 is a block diagram of the conventional frequency dividing circuit E'. In FIG. 4, output from the Q terminal of a D-type flip flop (hereafter referred to as "DFF") 3' is fed back to the D input terminal through a variable delay element 1 and an OR gate 2. The delay time at this variable delay element 1 is controlled by the control signal 101. The output of AND gate 6 is input to the other input terminal of the OR gate 2. The output of this AND gate 6 is the logical product of the Q output of DFF 4 and a signal that is the QB output of DFF 4 delayed by the delay element 5. The output of this AND gate 6 is input to the D input terminal of DFF 3' through the OR gate 2.

The frequency dividing circuit E' outputs a frequency-divided signal 104 synchronized with the input clock 102. More specifically, while clock 102 is input to the clock terminals of DFF 3' and DFF 4 respectively, the start signal 103 is input to the CD terminal of DFF 3' and the D input terminal of DFF 4. As a result, the Q output and the QB output of DFF are generated. Subsequently, the Q output of DFF 4 and the signal, that is QB output of DFF 4 delayed by the delay element 5, are input to the AND gate 6. The result is that positive pulse 105 is generated synchronized with the input clock 102 from the AND gate 6, and this positive pulse 105 is supplied to the D input terminal of DFF 3' through the OR gate 2.

When clock 102 is input to the clock terminal of DFF 3', the frequency dividing operation starts, triggered by the positive pulse 105. As a result, the frequency-divided signal 104 of the clock 102 is output from the inverted output QB terminal of DFF 3'. The output pulse of the Q terminal of DFF 3' is delayed by a specific time set by the control signal 101, is fed back to the D input terminal of DFF 3', and the frequency dividing operation of DFF 3' is continued. In this way, the frequency-divided signal 104 of the clock is output from the output terminal of DFF 3'.

The frequency dividing circuit E' that outputs the frequency-divided signal 104 synchronized with the input clock 102 is provided with DFF 3', variable delay element 1 and DFF 4. Clock 102 is input to the clock terminal of this DFF 3', and the inverted output QB terminal of the DFF 3' outputs the frequency-divided signal 104 of clock 102. The variable delay element 1 delays the output pulse of the non-inverted Q output terminal of the DFF 3' by the specified setting time, and feeds it back to the D input terminal. DFF 4 is required to generate pulse 105 synchronized with the clock 102 at the start of the frequency dividing operation (see Japanese patent publication No. 2055380 (page 3 and in FIG. 1)).

However, the conventional frequency dividing circuit is not provided with means for detecting the relationship between the edge of the signal fed back to the D input terminal through the variable delay element 1 and the timing of the edge of clock 102. For this reason, when the timing relationship does not satisfy the setup/hold time of DFF 3', then the DFF 3' causes a meta-stable phenomenon, and the frequency division output becomes unstable. As is already known, meta-stable phenomenon refers to the unstable condition of the output signal when the setup time or the hold time is not maintained in the latch or flip-flop input signal. This meta-stable phenomenon varies from several tens of ps to several ns in standard logic, and it becomes critical jitter in high speed operations at about 40 GHz.

In addition, when the frequency of clock 102 changes, the meta-stable phenomenon may occur. For this reason, a control signal corresponding to the frequency of clock 102 should be used.

Generally, the variable delay element 1 may generate the meta-stable phenomenon when the delay varies with the temperature. For this reason, a control signal calibrated with the temperature variation must be used.

Thus, it is difficult to obtain a stable and low jitter frequency-divided signal in high speed operations of about 40 GHz.

SUMMARY OF THE INVENTION

The present invention takes into consideration the circumstances mentioned above. The object of the present invention is to offer a frequency dividing circuit that can output stable and low-jitter frequency-divided signals especially in high speed operations.

To solve the problems mentioned above, in accordance with a first aspect of the present invention, a frequency dividing circuit includes: a D-type flip flop that outputs a frequency-divided signal synchronized with input clock and a reverse phase signal corresponding to the frequency-divided signal; a variable delay circuit that generates a delay feedback signal delayed by a specific delay time from the reverse phase signal input from said D-type flip flop and feeds back the delay feedback signal to said D-type flip flop; and a delay adjusting circuit that detects a phase difference between the reverse phase signal input from said D-type flip flop and the delay feedback signal input from said variable delay circuit, obtains detected results, and outputs to said variable delay circuit a control signal to perform control so that the delay time becomes time required to ensure setup/hold time of said D-type flip flop based on the detected results.

In accordance with a second aspect of the present invention, a frequency dividing circuit includes: a D-type flip flop that outputs a frequency-divided signal synchronized with input clock and a reverse phase signal corresponding to the frequency-divided signal; a variable delay circuit that generates a delay feedback signal delayed by a specific delay time from the reverse phase signal input from said D-type flip flop and feeds back the delay feedback signal to said D-type flip flop; and a delay adjusting circuit that detects a phase difference between the delay feedback signal input from said variable delay circuit and the input clock, obtains detected results, and outputs to said variable delay circuit a control signal to perform control so that the delay time becomes time required to ensure setup/hold time of said D-type flip flop based on the detected results.

According to the present invention, the object of minimizing jitter is realized by controlling the phase difference detected by using a pulse width equivalent to the sum of the delay time and setup time required for the D-type flip flop (DFF) such that it coincides with the target time. More specifically, the delay time of the variable delay circuit is controlled by applying negative feedback using delay locked loop (hereafter referred to as "DLL").

Since the delay time is automatically adjusted by negative feedback of DLL, the setup/hold time is always ensured, the DFF does not cause the meta-stable condition, and the frequency-divided signal can be output at low jitter. Consequently, stable and low-jitter frequency dividing circuit can be attained even during high speed operations.

DETAILED DESCRIPTION OF THE INVENTION

Figure 1:
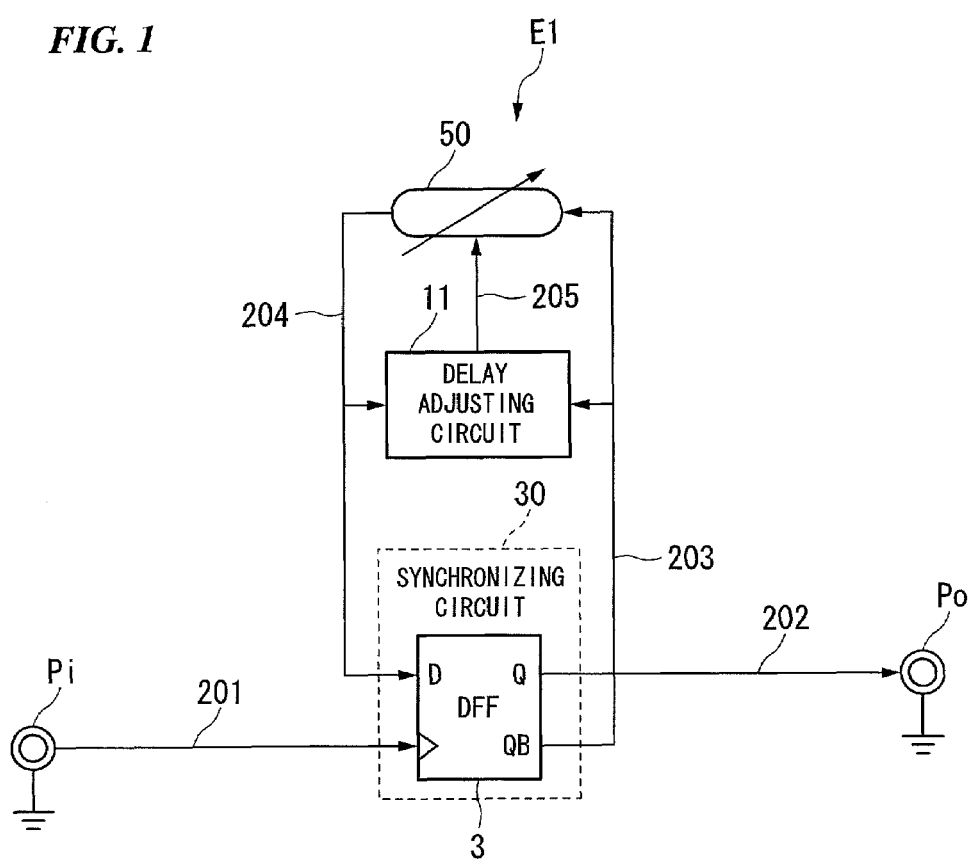
FIG. 1 shows the block diagram of the frequency dividing circuit according to an embodiment of the present invention.

Embodiments of the frequency dividing circuit according to the present invention will be described with reference to the drawings. The same reference numerals are attached to the same functions in all the drawings and explanations are omitted.

FIG. 1 shows the block diagram of the frequency dividing circuit E1 according to an embodiment of the present invention.

The frequency dividing circuit E1 shown in FIG. 1 is provided with input terminal Pi, synchronizing circuit 30, variable delay circuit 50, delay adjusting circuit 11, and output terminal Po. The input clock 201 is input to the input terminal Pi. The synchronizing circuit 30 has DFF 3. The variable delay circuit 50 variably delays signals fed back to the synchronizing circuit 30. The delay adjusting circuit 11 controls the delay time of this variable delay circuit 50. The output terminal Po outputs the frequency-divided signal 202 from the synchronizing circuit 30.

The delay adjusting circuit 11 is provided with at least one of the following: phase detector (abbreviated as "PD"), phase frequency detector (abbreviated as "PFD"), exclusive OR (abbreviated as "XOR"), logical product circuit (AND), frequency mixer, low-pass filter (abbreviated as "LPF"). For example, the delay adjusting circuit 11 may be formed by assembling PD and LPF, PFD and LPF, XOR and LPF, or AND and LPF, or by only the mixer.

Figure 2:
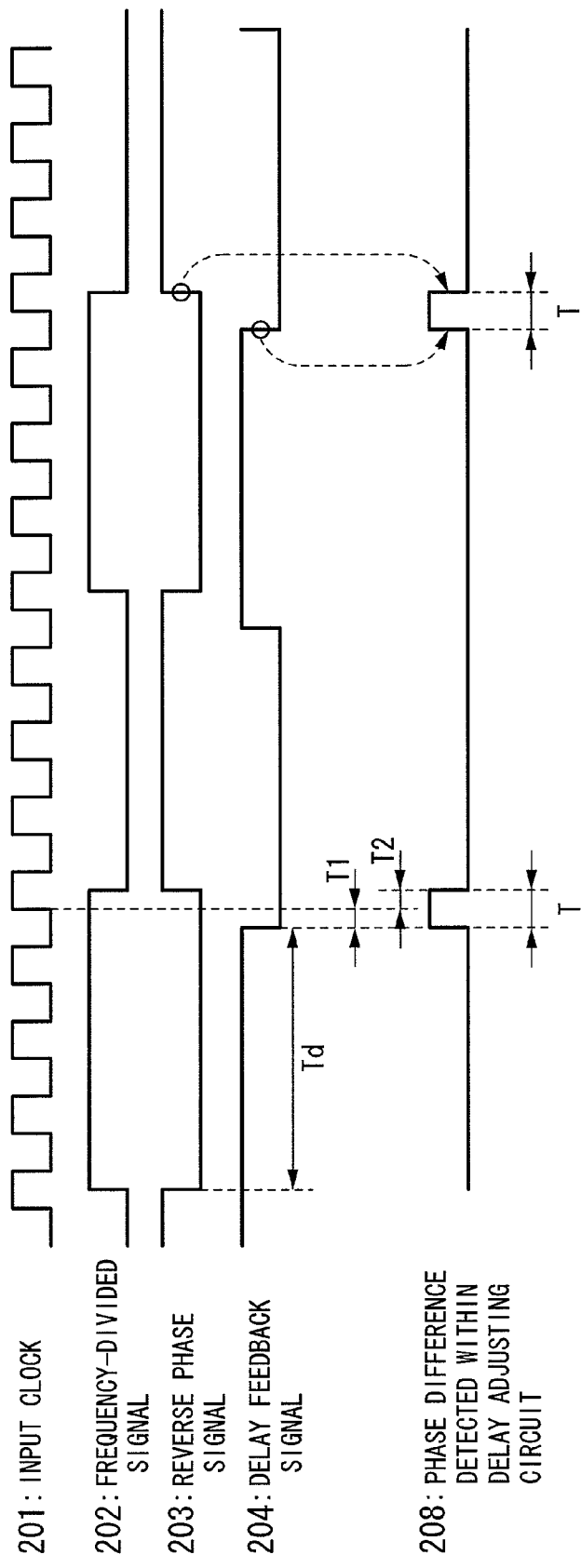
FIG. 2 is the timing chart of the frequency dividing circuit according to the embodiment of the present invention.

FIG. 2 is the timing chart of the frequency dividing circuit according to the embodiment of the present invention. FIG. 2 shows the timings of the input clock 201, frequency-divided signal 202, reverse phase signal 203, delay feedback signal 204, phase difference 208 detected within delay adjusting circuit 11 shown in FIG. 1. Furthermore, FIG. 2 shows the timings of delay time Td generated in the variable delay circuit 50, the setup time T1 of DFF 3, and the delay time T2 from the rising edge of the time of clock input 201 to DFF 3 to the falling edge of the output of the frequency-divided signal 202 or the rising edge of the reverse phase signal 203.

The delay adjusting circuit 11 detects the phase difference 208 (see FIG. 2) of the two signals that have been input. The delay adjusting circuit 11 generates the control signal 205 that can stabilize the phase difference 208 to the desired value, based on this detected result. This control signal 205 is input to the variable delay circuit 50, and thereby the delay time Td (see FIG. 2) is adjusted. The phase difference 208 is output as a pulse so that accurate measurements are possible. However, there is but one example of phase difference 208 being measured by pulse conversion. For example, the phase difference is output by a direct current component when phase detection is conducted by a mixer. This direct current component is equivalent to the value of the pulse mentioned above smoothed by an LPF.

In the present embodiment, the phase difference 208 measured by pulse conversion in this way or by other method, is converted by the delay adjusting circuit 11 to direct current component by an LPF. Based on this direct current component, a control signal 205 converted to voltage or current is generated, which is proportional to the phase difference 208. This control signal 205 is input to the variable delay circuit 50, and negative feedback is applied to the phase difference 208 to control it to the desired value, and the variable delay quantity is controlled.

That is, the delay adjusting circuit 11 detects the phase difference 208 between the delay feedback signal 204, and the reverse phase signal 203 (or the frequency-divided signal 202) output from the synchronizing circuit 30. The delay adjusting circuit 11 controls the delay time Td of the variable delay circuit 50 based on the phase difference 208. This variable delay circuit 50 feeds back the reverse phase signal 203 to the synchronizing circuit 30 after delaying it by the desired delay time Td.

The synchronizing circuit 30 is constituted by DFF 3, and the input clock 201 is input to this DFF 3 from the input terminal Pi. The frequency-divided signal 202 synchronized with this input clock 201 is led to the output terminal Po after it is output by positive logic (non-reverse phase signal) from the Q terminal of DFF 3. Moreover, the reverse phase signal 203 of negative logic (reverse phase signal) that is reversed frequency-divided signal, is output from the QB terminal. This reverse phase signal 203 is input to the delay adjusting circuit 11 and the variable delay circuit 50.

The delay feedback signal 204 output by the variable delay circuit 50 is input to the D terminal of DFF 3, and is also input to the delay adjusting circuit 11. The control signal 205 output from the delay adjusting circuit 11, acts as the variable delay quantity which controls the delay time Td when it is input to the variable delay circuit 50.

The variable delay circuit 50 is a circuit that can freely vary the delay amount in accordance with the control signal 205.

For the same control signal 205, the delay amounts set are the same when passing the rising edge of the signal and when passing the falling edge of the signal. If they are not the same, then the duty ratio of the frequency-divided signal will not be 50%. As a result, although a meta-stable phenomenon may not be initiated by the rising edge, this phenomenon may be initiated by the falling edge (or vice versa).

As mentioned above, meta-stable phenomenon refers to the unstable condition of the output signal when the setup time or the hold time is not maintained in the latch or flip-flop input signal. This meta-stable phenomenon varies from several tens of ps to several ns in standard logic, and it becomes critical jitter in high speed operations at about 40 Hz.

At the left end of FIG. 2, a waveform edge synchronized with timing delayed by the delay time T2 from the rising edge of the input clock 201, is formed in the frequency-divided signal 202 and the reverse phase signal 203. Based on the edge of the reverse phase signal 203, the variable delay circuit 50 generates and outputs the delay feedback signal 204, which is delayed by the delay time Td from this edge, and inputs it to the D terminal of DFF 3.

The edge of the delay feedback signal 204 is set at the position shifted by the setup time of time T1 from the rising edge of the input clock 201.

The time from the falling edge of the delay feedback signal 204 to the rising edge of the reverse phase signal 203 (pulse width T) is detected as the phase difference 208 within the delay adjusting circuit 11. PD, PFD or other logically combined circuits disposed within the delay adjusting circuit 11 may be used as the detecting device. The detected pulse polarity is an example; reversing the polarity of the pulse is also acceptable.

The pulse width T of the detected phase difference 208 is equivalent to the sum of the setup time T1 and the delay time T2 required for DFF 3. If this pulse width T is controlled so that it matches the target time given, then jitter can be minimized. More specifically, the delay time of the variable delay circuit 50 is controlled by applying negative feedback using DLL (delay locked loop).

Since the delay time Td is automatically adjusted by negative feedback of DLL, the setup/hold time of DFF 3 is always ensured. For this reason, the meta-stable condition does not occur, and the frequency-divided signal 202 can be output with low jitter.

Even if the frequency of input clock 201 changes, the delay time TD is automatically adjusted. For this reason, DFF 3 outputs the frequency-divided signal 202 in accordance with the frequency of the input clock 201.

Even if the delay time within the circuit has changed because of a temperature change, the delay time TD is automatically adjusted; so the change can be absorbed. Thus the effect is that adverse influence of temperature characteristics is not received.

In this way, the setup/hold time of DFF can be ensured by a DLL that detects the phase difference 208 of an input/output signal of the synchronizing circuit 30 and controls the variable delay circuit 50. Moreover, DFF 3 can be driven in a stable manner regardless of changes by temperature in delay quantity or frequency of the input clock. For this reason, a frequency-divided signal with low jitter can be obtained. Thus, stable and low-jitter frequency-divided signal can be obtained even during high speed operations at about 40 GHz with the frequency dividing circuit E1.

The important points of the frequency dividing circuit E1 shown in FIG. 1 and FIG. 2 are the frequency dividing circuit E1 including: the D-type flip flop 3 that outputs the frequency-divided signal 202 synchronized with the input clock 201 and the reverse phase signal 203 corresponding to the frequency-divided signal 202; the variable delay circuit 50 that generates the delay feedback signal 204 delayed by a specific delay time Td from the reverse phase signal 203 input from the D-type flip flop 3 and feeds back the delay feedback signal 204 to the D-type flip flop 3; and the delay adjusting circuit 11 that detects the phase difference T between the reverse phase signal 203 input from the D-type flip flop 3 and the delay feedback signal 204 input from the variable delay circuit 50, obtains the detected results, and outputs to the variable delay circuit 50 the control signal 205 to perform control so that the delay time Td becomes the time required to ensure the setup/hold time of the D-type flip flop 3, based on the detected results.

In accordance with this frequency dividing circuit E1, stable and low-jitter frequency dividing circuit can be obtained even during high speed operation.

Figure 3:
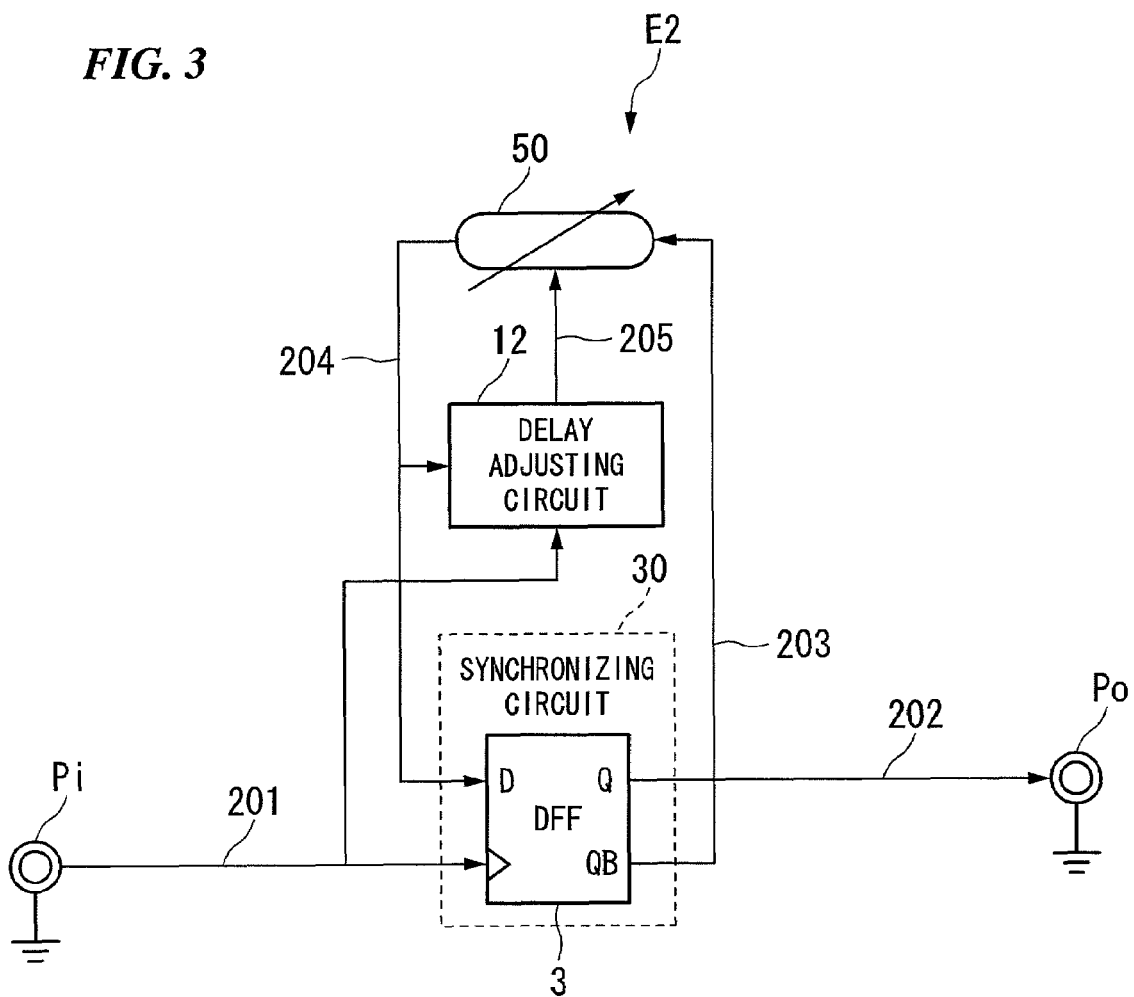
FIG. 3 shows the block diagram of the frequency dividing circuit according to an example of modification of the embodiment of the present invention.
Figure 4:
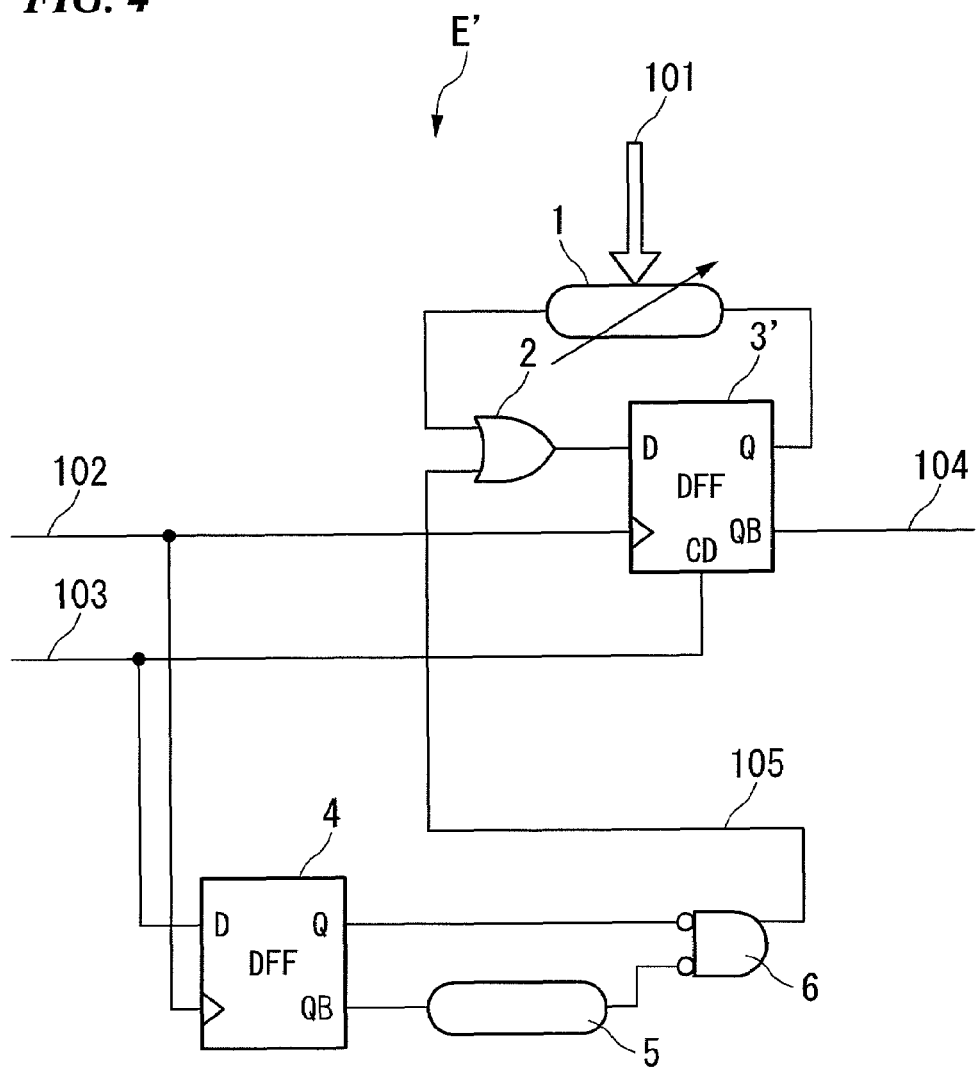
FIG. 4 shows the block diagram of a conventional frequency dividing circuit.

FIG. 3 shows the block diagram of the frequency dividing circuit E2 according to an example of modification of the embodiment of the present invention. The different point compared to E1 shown in FIG. 1 is that the input clock 201 input from the input terminal Pi is also connected to the delay adjusting circuit 12. Also, the reverse phase signal 203 output from the QB terminal of DFF 3 is not connected to the delay adjusting circuit 12, and thus not input to it. The internal configuration of the delay adjusting circuit 12 is practically similar to the delay adjusting circuit shown 11 in FIG. 1.

The delay adjusting circuit 12 detects the phase difference T1 between the delay feedback signal 204 and the input clock 201. The control signal 205 is output in order that the phase difference T1 be a constant value. By configuring DLL in this way, the setup time can be ensured without receiving the adverse influence of temperature characteristics corresponding to the delay time from the input of the input clock 201 in DFF to the output of the frequency-divided signal 202. These are built on premises that the frequency of the frequency-divided signal 202 is adequately smaller than the frequency of the input clock 201, and that the hold time is ensured.

Similarly, the delay adjusting circuit 12 detects the phase difference using the delay feedback signal 204, and the falling edge of the input clock 201. The control signal 205 may be output such that this phase difference becomes zero. In this case, not only is the setup time ensured, but also the time difference between the edge position of the delay feedback signal 204 and the rising edge of input clock 201 becomes maximum. For this reason, the error occurrence rate in DFF 3 can be minimized from the long-term view. However, the premise is that the hold time is ensured, similar to the premise mentioned above.

The main point of the frequency dividing circuit E2 shown in FIG. 3 is to detect the phase difference T1 between the input clock 201 input to the D-type flip flop 3 and the delay feedback signal 204 input to the D-type flip flop 3, with the delay adjusting circuit 12. The variable delay circuit 50 is controlled based on this phase difference T1. In accordance with this frequency dividing circuit E2, the setup/hold time of DFF 3 can be ensured by the DLL that detects the phase difference T1 and controls the variable delay circuit 50. Accordingly, stable operation of DFF 3 can be attained without being affected by frequency characteristics of the input clock 201 or the temperature characteristics of the delay quantity. For this reason, stable and low-jitter frequency-divided signal 202 can be obtained even during high speed operations of about 40 GHz.

The operating sequence and shapes and combinations of the various constituent elements in the above-described embodiments are merely examples, and it is possible to make variations thereof, based on process condition and design requirements, within the scope of the spirit of the present invention. For example, the invention is suitable for trigger circuits in sampling oscilloscopes. It can also be used in bit error testers and jitter measuring instruments for measuring the quality of communication signals in a high speed digital network.

What is claimed is:

1. A frequency dividing circuit comprising:
   a D-type flip flop that outputs a frequency-divided signal synchronized with input clock and a reverse phase signal corresponding to the frequency-divided signal;
   a variable delay circuit that generates a delay feedback signal delayed by a specific delay time from the reverse phase signal input from said D-type flip flop and feeds back the delay feedback signal to said D-type flip flop; and
   a delay adjusting circuit that detects a phase difference between the reverse phase signal input from said D-type flip flop and the delay feedback signal input from said variable delay circuit, obtains detected results, and outputs to said variable delay circuit a control signal to perform control so that the delay time becomes time required to ensure setup/hold time of said D-type flip flop, based on the detected results.

2. The frequency dividing circuit according to claim 1, wherein said delay adjusting circuit controls the delay time by applying negative feedback control of delay locked loop.

3. A frequency dividing circuit comprising:
   a D-type flip flop that outputs a frequency-divided signal synchronized with input clock and a reverse phase signal corresponding to the frequency-divided signal;
   a variable delay circuit that generates a delay feedback signal delayed by a specific delay time from the reverse phase signal input from said D-type flip flop and feeds back the delay feedback signal to said D-type flip flop; and
   a delay adjusting circuit that detects a phase difference between the delay feedback signal input from said variable delay circuit and the input clock, obtains detected results, and outputs to said variable delay circuit a control signal to perform control so that the delay time becomes time required to ensure setup/hold time of said D-type flip flop, based on the detected results.

4. The frequency dividing circuit according to claim 3, wherein said delay adjusting circuit controls the delay time by applying negative feedback control of delay locked loop.

* * * * *